US007746160B1

(12) United States Patent
Raghavan et al.

(10) Patent No.: US 7,746,160 B1

(45) Date of Patent: Jun. 29, 2010

(54) SUBSTRATE BIAS FEEDBACK SCHEME TO REDUCE CHIP LEAKAGE POWER

(75) Inventors: Vijay Kumar Srinivasa Raghavan, Colorado Springs, CO (US); Iulian Gradinariu, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/380,492

(22) Filed: Feb. 26, 2009

Related U.S. Application Data

(63) Continuation of application No. 11/478,006, filed on Jun. 28, 2006, now Pat. No. 7,504,876.

(51) Int. Cl.
*H03K 3/01* (2006.01)

(52) U.S. Cl. ..................................................... 327/534

(58) Field of Classification Search ................ 327/534, 327/535, 536, 537
See application file for complete search history.

(56) References Cited

U.S. PATENT DOCUMENTS 5,140,182 A 8/1992 Ichimura
5,499,183 A 3/1996 Kobatake
5,574,634 A 11/1996 Parlour et al.
5,982,223 A 11/1999 Park et al.
6,018,264 A * 1/2000 Jin ............................ 327/536
6,175,264 B1 1/2001 Jinbo
6,292,048 B1 9/2001 Li
6,373,323 B2 4/2002 Kuroda
6,373,324 B2 4/2002 Li et al.
6,459,328 B1 10/2002 Sato
6,473,321 B2 10/2002 Kishimoto et al.
6,486,729 B2 11/2002 Imamiya
6,529,421 B1 * 3/2003 Marr et al. ............. 365/189.09
6,545,529 B2 4/2003 Kim
6,759,836 B1 7/2004 Black, Jr.
6,917,237 B1 * 7/2005 Tschanz et al. ............. 327/513
6,927,621 B2 * 8/2005 Yamada ...................... 327/537
7,030,682 B2 * 4/2006 Tobita ........................ 327/536
7,116,156 B2 10/2006 Myono et al.
7,173,477 B1 * 2/2007 Raghavan .................. 327/536
7,227,403 B2 * 6/2007 Kim ........................... 327/536
7,276,960 B2 * 10/2007 Peschke ..................... 327/536
7,307,467 B2 12/2007 Goodnow et al.
7,425,861 B2 * 9/2008 Egerer et al. ................ 327/534
7,504,876 B1 3/2009 Raghavan et al.

OTHER PUBLICATIONS

U.S. Appl. No. 11/478,006, Raghavan et al.

Notice of Allowance and Issue Fee Due for U.S. Appl. No. 11/478,006 dated Oct. 31, 2008.

USPTO Non-Final Rejection for U.S. Appl. No. 11/478,006 dated Nov. 21, 2007; 4 pages.

USPTO Notice of Allowance for U.S. Appl. No. 10/978,045 dated Oct. 19, 2006; 6 pages.

USPTO Final Rejection for U.S. Appl. No. 10/978,045 dated Aug. 3, 2006; 7 pages.

USPTO Non-Final Rejection for U.S. Appl. No. 10/978,045 dated Apr. 5, 2006; 7 pages.

McGowen et al., "Power and Temperature Control on a 90-nm Itanium Family Processor," IEEE Journal of Solid-State Circuits, vol. 41, No. 1, Jan. 2006, pp. 229-237; 9 pages.

(Continued)

*Primary Examiner*—Jeffrey S Zweizig

(57) ABSTRACT

Disclosed is an improved substrate bias feedback circuit, and a method for operating the same.

18 Claims, 3 Drawing Sheets

200

OTHER PUBLICATIONS

USPTO Notice of Allowance for U.S. Appl. No. 11/705,288 dated Feb. 5, 2010; 8 pages.

USPTO Non-Final Rejection for U.S. Appl. No. 11/705,288 dated Jul. 21, 2009; 8 pages.

* cited by examiner

300

SUBSTRATE BIAS FEEDBACK SCHEME TO REDUCE CHIP LEAKAGE POWER

This application is a continuation of U.S. patent application having Ser. No. 11/478,006, filed Jun. 28, 2006, and issued as U.S. Pat. No. 7,504,876, the contents of which are incorporated by reference herein.

TECHNICAL FIELD

The present invention relates generally to electronic circuits, and in particular to substrate bias circuits.

BACKGROUND

In state of the art process technologies such as those with line widths of 65 nanometers (nm) and 90 nanometers, there is significant sub-threshold leakage in cells even if the cell is in a steady state. Ideally in Static Random Access Memory (SRAM) memory circuits if a cell is not switching, no current should be drawn. However, as line widths get smaller, leakage becomes a problem even when the cells are not switching i.e., when the cells are in standby mode. This is a concern in battery powered and mobile applications where power conservation is of great importance. Furthermore SRAM circuits need to be able to wake from standby mode (where very little/no current is drawn) to active mode (where circuit is operating normally) Very quickly.

A number of conventional chip leakage solutions for reducing the chip leakage power are described. In a first conventional solution the chip power supply is reduced during standby conditions and brought back to nominal voltages during active mode. Disadvantages of this first conventional solution include that the chip power supply needs to be brought back higher during active condition which means there is a startup time from standby to active. Also, this first conventional solution needs to be implemented as a die-by-die tweak because it is not a closed loop system.

In a second conventional solution low speed, high threshold voltage (Vt) or multiple Vt technologies are used to lower current leakage. Employing a high Vt technology slows down the entire chip, because the high threshold voltage causes all transistors to switch slowly. Solutions employing multi-Vt technologies are expensive due to the additional mask steps required to implement multi-Vt technologies during wafer manufacturing. For example, using older high line-width technologies such as 0.25 micrometer (um) or 250 nanometer (nm) technologies, a full mask set cost approximately one hundred thousand US dollars. Today a full mask set using cutting edge 65 nm technology costs approximately nine hundred thousand US dollars, with a cost of fifty thousand US dollars for each additional mask step. With such expensive technologies, using additional masks to implement multi-Vt technologies is a pricey solution. Furthermore, with multi-Vt technologies there is no feedback mechanism based on transistor leakage to control leakage current with process, voltage and temperature (PVT).

In a third conventional solution a constant substrate reverse bias reference voltage is set at wafer sort by doing a die by die tweak to get to the optimal substrate bias voltage for each die. This reverse bias operation uses a negative reference voltage for N-channel transistors, and uses a positive reference voltage for P-channel transistors. This die-by-die tweak costs additional test time per die, and the bias does not change automatically with voltage and temperature i.e. this is an open loop system with no feedback.

In a fourth conventional solution shown in FIG. 1 a speed to voltage converter circuit 100 may be used to control power supply. The speed to voltage converter 100 comprises an input signal 110, which may be a clock or other periodic signal, coupled to a replica delay path block 130 which introduces a propagation delay time (Tpd). The output of the replica delay path block 130 is coupled to an input of a speed to voltage converter block 140, which generates a voltage proportional to the propagation delay time. The output of the speed to voltage converter block 140 is coupled to a first input of a comparator 150. A reference voltage block 120 provides a bandgap reference to a second input of the comparator 150. The output of the comparator 150 is coupled to a voltage and bias generator block 160. The output of this bias generator block 160 is used to bias the transistors in the device. The speed (or frequency) to voltage converter can also be used to regulate speed by comparing the speed of a replica circuit with a reference voltage such as that produced by a bandgap.

Disadvantages of the fourth conventional solution include that since this solution changes the power supply voltage or bias based on the speed of a circuit (the delay of a delay chain), this is not a direct and accurate representation of the leakage in a device. Hence the leakage reduction is not optimal. Furthermore, delay circuits are usually slower at high temperatures making the feedback system operate as if it is a slow corner or a less leaky corner and hence the substrate bias is not applied. But the sub-threshold leakages are indeed worse at higher temperatures and hence the substrate bias should be applied. This difference in temperature dependence of delays and sub-threshold leakage make this feedback scheme unsuitable for reducing leakage power.

In a fifth solution, the leakage is reduced to a minimum possible level by finding a bias point based on the combination of GIDL (gate induced drain leakage), sub-threshold current and gate leakage currents. But this effectively reduces the speed of the circuit during active mode because the minimum leakage point corresponds to a slow corner which is slow in terms of speed. Hence, to get better speed during active mode, the reverse substrate bias has to be removed or reduced during active mode which takes time (typically in the high hundred of nanoseconds or low microseconds). This increases standby to active access time which is a very critical specification for memory circuits (for example, the standby to active time of memory circuits are in the single digit nanoseconds).

It would be desirable to have solution that reduces the chip leakage power based on a low ripple/noise feedback scheme that is derived from leakage parameters of a device and also works across process, voltage and temperature. It is also desirable that the same substrate bias be used during standby and active mode to not affect standby to active access time in high speed memories. Since memory chips are usually designed to meet speed, leakage and active power optimally at the typical corner for highest yield, the goal of the ideal feedback solution is to make fast/leaky process corners and high voltage/temperature corners look like a typical PVT corner (which has lower leakage power without sacrificing speed specifications).

DETAILED DESCRIPTION

An embodiment is described of an improved substrate bias feedback scheme to reduce chip leakage power. This invention comprises a substrate reverse bias feedback system which automatically sets the reverse bias voltage needed for the chip across process, voltage and temperature (PVT). The reverse bias is applied on the bulk/substrate of transistors to increase the threshold voltage of the transistors resulting in leakage reduction. The system uses a closed loop low ripple negative charge pump system controlled by an operational amplifier (op-amp) system to output the required substrate reverse bias voltage. The feedback system compares the leakage on a baseline device (for example a memory cell) to a target current value and automatically sets the required bias voltage on the baseline device. In one embodiment of this invention, simulations show leakage current reduction of approximately eighty five percent.

Figure 2:
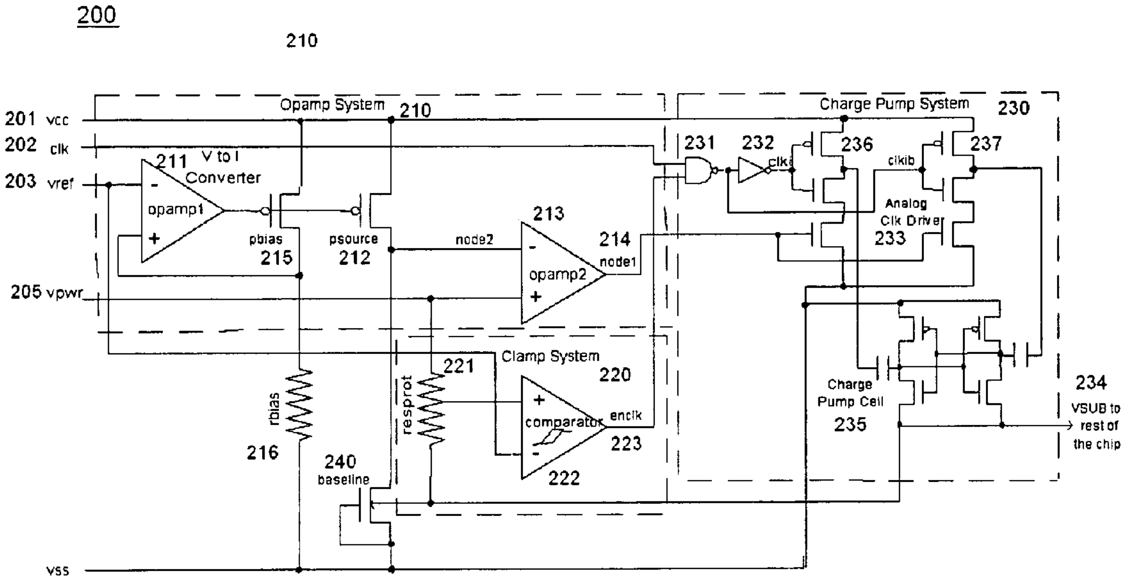
FIG. 2 illustrates an improved n-channel transistor substrate bias feedback scheme to reduce chip leakage power.

FIG. 2 shows an architecture of an substrate bias feedback circuit 200. The circuit 200 comprises an operational amplifier (op-amp) system 210 having external power 201 (vcc), clock 202 (clk), reference voltage 203 (vref) and the internal regulated chip power supply 205 (vpwr) inputs. The op-amp block 210 has an output 214 (node1) which is coupled to an input of a charge pump system 230. The charge pump system 230 further comprises power 201 (vcc) and clock 202 (clk) inputs and the node1 214 signal from block 210. The charge pump system 230 has an output signal 234 VSUB which represents the desired substrate voltage. This signal is passed to the rest of the chip, and is also fed back to clamp system 220 and used to bias baseline transistor 240.

The objective of the n-channel reverse bias system 200 is to output a reverse bias voltage 234 that will be applied to the body of the n-channel transistors in the core of the memory cell to reduce sub-threshold leakage. The system is designed such that it outputs a reverse body bias voltage at the high leakage corners i.e., fast/leaky silicon corners, high temperature and high voltage (vpwr) conditions.

Figure 1:
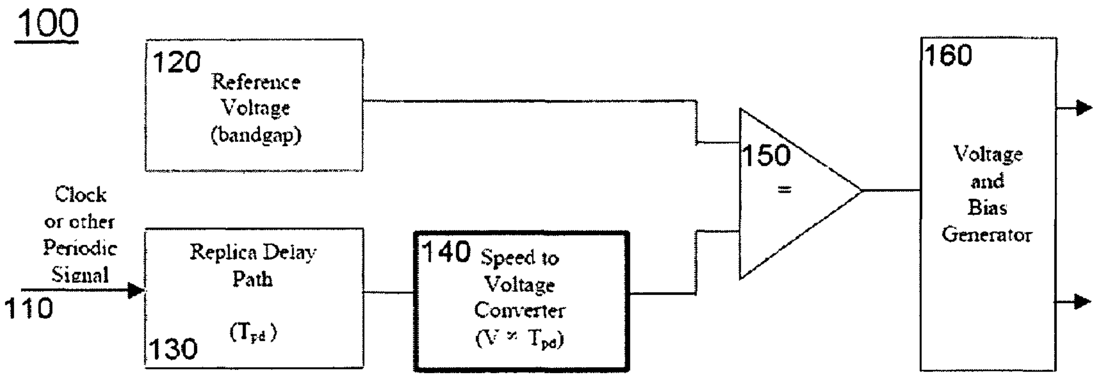
Figure 1. (Prior Art)
FIG. 1 (Prior Art) illustrates a conventional speed to voltage converter circuit used to control a power supply.

The operational amplifier (op-amp) block 210 comprises a first operational amplifier 211 (indicated as "Opamp1"). This operational amplifier 211 along with transistor "pbias" 215 converts a reference voltage 'Vref' 203 to a reference current equal to vref/rbias where vref is the reference voltage and rbias is the resistance of resistor 'rbias' 216. The output of operational amplifier 211 is a bias voltage to the gate of a p-transistor "psource" 212 to supply a reference current output through the baseline device 240. Transistor "psource" 212, has a source coupled to voltage vcc 201, and a drain coupled to node2 which is the negative terminal of a second operational amplifier 213 (indicated as "Opamp2"). The reference current is compared with the leakage current through a baseline circuit 240 "baseline" (this circuit represents the N-transistors of a memory cell) to determine the amount of reverse body bias needed. The goal is to reduce the leakage through the circuit "baseline" to be less than or equal to the current set by the voltage to current converter. Though the circuit 240 named "baseline" shown in FIG. 1 is an n-channel transistor, this can substituted with any group of n-transistors of a circuit for which the leakage is being reduced.

The node1 output 214 of the second operational amplifier "opamp2" provides the necessary analog control bias for the negative charge pump block 230. By virtue of negative feedback, the second operational amplifier "opamp2" tries to maintain a voltage equal to the internal chip power supply voltage (vpwr) 205 on "node2" for measuring leakage. If the leakage current through the circuit "baseline" 240 is higher than what is set by "opamp1" 211 through the device "psource" 212, then "node2" starts to drop below "vpwr" 205 voltage. This in turn increases the output voltage of "opamp2" 213 i.e., "node1" 214 goes high. If "node1" 214 goes high, the charge pump turns ON hard and hence starts increasing the reverse body bias on "baseline" 240. The increase of reverse body bias in "baseline" 240 increases its threshold voltage and hence its leakage current starts to reduce. Thus the feedback system increases the reverse body bias until the leakage through instance "baseline" is less than or equal to the current set by the p-channel source "psource" 212. In this way, the system automatically supplies the correct reverse body bias required for the n-channel transistors for various PVT.

Clamp system 220 comprises a resistor 221 "resprot" (in one embodiment a variable resistive divider) having a first end coupled to power 201 and a second end coupled to a substrate voltage VSUB 234. A variable output of the resistor is coupled to a positive input of a comparator 222. A negative input of comparator 222 is coupled to the reference voltage "vref" 203. An output node 223 'enclk' of comparator 222 is coupled to charge pump system 230.

In the clamp system 220, the comparator 222 limits the maximum reverse body bias applied to the chip for reliability reasons and to limit GIDL (Gate Induced Drain Leakage) current. During transient overshoot or if there is a process, voltage or temperature (PVT) at which the automatic reverse body bias control decides on a voltage lower than a desirable level (in one example negative 1V) and if the clamp level is set at −1V, then the comparator system disables the charge pump once the substrate reaches around −1V. The clamping level of reverse body bias voltage can be changed by options in the resistive divider "resprot" 221.

The charge pump system 230 comprises a NAND gate 231 having clk 202 and clock enable enclk 223 input, an inverter 232, an analog clock driver 233, a charge pump cell 235 and a pump output 234. The charge pump is ON when enclk is logic high and is OFF when enclk is logic low. The output signal 'clkib' of NAND gate 231 is coupled to inverter 232. The output of inverter 232 is the clock signal 'clki' which is coupled to a first side analog clock driver block 233. The output signal 'clkib' of NAND gate 231 is coupled to a second side of analog clock driver block 233. The analog clock driver 233 has a first output 236 from its first side, and a second output 237 from its second side. The first output 236 and second output 237 are coupled to charge pump cell 235. The charge pump 235 generates output 234 VSUB substrate voltage to be applied to the chip.

The charge pump system 230 operates by pumping the substrate to a negative voltage for n-channel reverse body bias. The analog voltage at "node1" 214 determines the amplitude of the clock from the analog clock driver 233 to the charge pump cell 235. This analog control of the charge pump results in an ultra low ripple output (around 5 mV). In one embodiment, simulations show that the worst case leakage current (fast corners) is reduced by around 85% due to automatic body bias control.

The objective of the n-channel reverse bias system is to output a reverse bias voltage that will be applied to the body of the n-channel transistors in the core of the memory cell to reduce sub-threshold leakage. The system is designed such that it outputs a reverse body bias voltage at the high leakage corners i.e., fast/leaky silicon corners and high voltage/temperature conditions.

Advantages of the improved solution include providing an accurate low ripple substrate bias voltage to reduce chip leakage regardless of process voltage and temperature (PVT). This solution also has the advantage of setting the bias voltage based on the leakage from a real baseline device from the chip (e.g. memory cell as a baseline device). Furthermore, this system does not require any kind of die-by-die tweak for the reverse bias setting since the system determines the bias voltage across PVT automatically. This leads to reduced test time cost and better yield. A further advantage is that this system does not require expensive multilevel threshold voltage (Vt) technologies, which are hard to control. The noise injection through the substrate is negligible due to the system's ultra low ripple bias output (ripple in the order of 5 mV). The leakage reduction is very high (in the order of 85% reduction) for worst case corners. Since the target leakage current is set such that fast/leaky and high voltage/temperature corners behave like a typical PVT corner, an added advantage is that the speed of the system is not compromised since memory chips are usually optimized to meet leakage/active power and speed specifications at the typical PVT setting. This system also has the clamp system to limit the charge pump output to keep substrate bias within technology and GIDL limits.

Further described is a method for determining a bias voltage, comprising converting a reference voltage to a reference current, comparing the reference current to a baseline leakage current, and generating a reverse bias voltage based upon the comparison of reference current to a baseline leakage current. The method comprises converting a reference voltage to a reference current comprises providing a reference voltage to a first operational amplifier and providing the output of the operational amplifier to the gate of a bias transistor and to the gate of a source transistor. The method may further comprise where the step of converting a reference voltage to a reference current comprises providing a reference voltage to a negative input of a first operational amplifier having a positive input coupled to the drain of a bias transistor, and providing the output of the operational amplifier to the gate of a source transistor.

The method may further comprise comparing the reference current to a baseline leakage current comprises driving a voltage at the drain of the source transistor to a voltage power level. In the improved method generating a reverse bias voltage comprises increasing an output voltage of a second operational amplifier when a leakage current through a baseline circuit is higher than the reference current. The method may further comprise generating a reverse bias voltage comprises increasing a voltage provided to a charge pump.

In an alternate embodiment the improved solution can be applied not only to n-channel reverse bias system but can also be used in p-channel reverse bias system.

Figure 3:
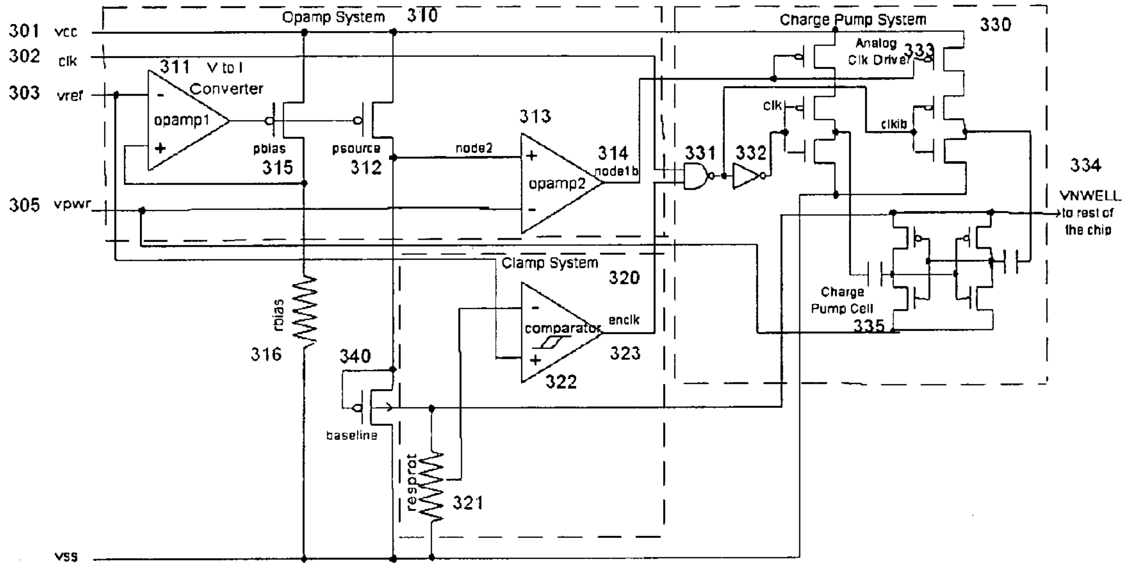
FIG. 3 illustrates an improved p-channel transistor substrate reverse bias feedback scheme to reduce chip leakage power.

FIG. 3 shows an architecture 300 for a p-channel substrate bias feedback circuit. The circuit 300 comprises an operational amplifier (op-amp) system 310 having external power 301 (vcc), clock 302 (clk), reference voltage 303 (vref) and the internal regulated chip power supply 305 (vpwr) inputs. The op-amp block 310 has an output 314 (node1*b*) which is coupled to an input of a charge pump system 330. The charge pump system 330 further comprises power 301 (vcc) and clock 302 (clk) inputs and the node1*b* 314 signal from block 310. The charge pump system 330 has an output signal 334 VSUB which represents the desired substrate voltage. This signal is passed to the rest of the chip, and is also fed back to clamp system 320 and used to bias baseline transistor 340. The operation of circuit 300 is similar to the operation of circuit 200 as described previously.

The n-channel reverse bias system employs a negative pump whereas the p-channel reverse bias system would employ a positive pump. The positive pump's output of higher than internal regulated supply voltage vpwr is applied to p-channel transistors' substrate or body to reduce its leakage. The above discussions have concentrated on reducing chip leakage (standby power) but the same system can also be used to reduce active power.

For normal operation, semiconductor memory devices have highest active power for fast corners and lower active power at typical corners for a given speed specification. Since this feedback scheme is essentially trying to make fast and high voltage corners look like typical corners, the active power is also reduced because the substrate bias is kept ON during both standby and active modes.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the improved solution and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A substrate bias circuit, comprising:

at least one baseline transistor having a plurality of terminals and a body;

a current source that provides a current output to at least one terminal of the base line transistor; and a charge pump circuit that applies a reverse body bias to the body of the base line transistor, the reverse body bias varying in response to a difference between a reference current and a current through the baseline transistor, wherein the charge pump circuit includes at least one charge pump cell that generates the reverse body bias in response to a control clock signal, and an analog clock driver that varies the control clock signal in response to the difference between the reference current and the current through the baseline transistor.

2. The substrate bias circuit of claim 1, wherein:

the baseline transistor has a gate and a source-drain path coupled between the current source and a first power supply node.

3. The substrate bias circuit of claim 1, wherein:

the current source includes a source transistor of a conductivity type different from that of the at least one baseline transistor, the source transistor having a gate coupled to receive a reference bias voltage, and a source-drain path coupled to the baseline transistor.

4. The substrate bias circuit of claim 3, wherein:

the current source further includes a bias transistor of the same conductivity type as the source transistor, the bias transistor having a gate coupled to receive the reference bias voltage, and a reference bias amplifier having an output that provides the reference bias voltage, a first input coupled to receive an input reference voltage, and a second input coupled to the bias transistor by a feedback path.

5. The substrate bias circuit of claim 1, further including:

a control amplifier having an output that provides an analog control voltage to the analog clock driver, a first input coupled to the baseline transistor, and a second input coupled to a reference voltage.

6. The substrate bias circuit of claim 5, wherein:

the analog clock driver varies the amplitude of the control clock signal in response to the analog control voltage.

7. A substrate bias circuit, comprising:

a charge pump that drives a substrate node to a reverse body bias voltage in response to at least one clock control signal;

an analog clock driver that generates at least one output clock signal in response to a periodic input clock signal, and varies the amplitude of the output clock signal in response to a node voltage; and a bias amplifier that generates the node voltage in response to a leakage current through at least one base line transistor, the baseline transistor having a body that receives the reverse body bias voltage.

8. The substrate bias circuit of claim 7, wherein:

the analog clock driver includes at least one bias device coupled between a clock logic circuit and a power supply, the bias device having an impedance controlled by the node voltage.

9. The substrate bias circuit of claim 7, wherein:

the bias amplifier has an output that provides the node voltage, a first input coupled to the baseline transistor, and a second input coupled to a reference voltage.

10. The substrate bias circuit of claim 7, further including:

the analog clock driver circuit disables the output clock signal in response to an enable signal; and a clamp circuit that generates the enable signal in response to the reverse body bias voltage exceeding a predetermined limit.

11. The substrate bias circuit of claim 10, wherein:

the clamp circuit includes a comparator having an output that provides the enable signal, a first input coupled to a reference voltage, and a second input coupled to the reverse body bias voltage.

12. The substrate bias circuit of claim 11, wherein:

the reverse body bias voltage is coupled to the second input of the comparator by a variable impedance.

13. The substrate bias circuit of claim 7, further including:

a current source transistor that receives a reference bias voltage at its gate;

the baseline transistor has a source-drain path connected in series with the source-drain path of the current source transistor; and the bias amplifier has an input coupled to a node between the source-drain paths of the current source transistor and the baseline transistor.

14. A method, comprising:

generating an analog control bias voltage in response to a comparison between a reference current and a leakage current flowing through at least one baseline transistor, the baseline transistor having a body the receives a reverse body bias voltage; and varying the reverse body bias voltage in response to the analog control bias voltage, wherein generating the analog control bias voltage includes generating a compare input voltage in response to a difference between the reference current and the leakage current through the baseline transistor, comparing the compare input voltage to a reference voltage to generate a compare result, and increasing or decreasing the reverse body bias voltage in response to the compare result.

15. The method of claim 14, further including:

generating the analog control bias voltage includes varying a compare node potential based on a difference between current capacity of a current source and the baseline transistor.

16. The method of claim 15, wherein:

generating the analog control bias voltage further includes the current capacity of the current source being established by a reference bias voltage, and the current capacity of the baseline transistor varying in response to the reverse body bias voltage.

17. The method of claim 14, wherein:

varying the reverse body bias voltage includes in response to the comparison between the reference current and the leakage current, modulating a power supply to at least a portion of a charge pump circuit that generates the reverse body bias voltage.

18. The method of claim 14, further including:

stopping the reverse body bias voltage when the reverse body bias voltage exceeds at least one limit.

* * * * *